United States Patent
Ikeda

(10) Patent No.: US 7,586,133 B2
(45) Date of Patent: Sep. 8, 2009

(54) SOLID STATE IMAGING APPARATUS AND DRIVING METHOD OF SOLID STATE IMAGING APPARATUS

(75) Inventor: Katsumi Ikeda, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 500 days.

(21) Appl. No.: 11/389,177

(22) Filed: Mar. 27, 2006

(65) Prior Publication Data

US 2006/0234415 A1  Oct. 19, 2006

(30) Foreign Application Priority Data

Mar. 28, 2005  (JP) ............... 2005-092556

(51) Int. Cl.
*H01L 29/762* (2006.01)
*H01L 21/339* (2006.01)

(52) U.S. Cl. ............... 257/215; 257/232; 257/E29.227; 438/75; 348/315

(58) Field of Classification Search ............... 257/232, 257/183.1, 215, E29.227, E29.234, E29.235, 257/E29.236, E21.456; 348/315
See application file for complete search history.

(56) References Cited

U.S. PATENT DOCUMENTS 6,248,133 B1 * 6/2001 Komobuchi et al. ......... 348/315

6,970,197 B2 * 11/2005 Nishi ......................... 348/312

FOREIGN PATENT DOCUMENTS

| JP | 60-138970 | 7/1985 |
| JP | 2004-159033 | 6/2004 |
| JP | 2004-194023 A | 7/2004 |

* cited by examiner

*Primary Examiner*—Lex Malsawma
(74) *Attorney, Agent, or Firm*—Birch, Stewart, Kolasch & Birch, LLP

(57) ABSTRACT

A solid state imaging apparatus comprises a semiconductor substrate, photoelectric conversion elements, a vertical electric charge transferring device, a horizontal electric charge transferring device that temporarily stores the signal electric charges transferred from the vertical electric charge transferring device and transfers the signal electric charges to a horizontal direction in a sequential order, wherein the horizontal electric charge transferring device comprises at least two lines of horizontal shift registers and an electrode structure with which one-- shift register can transfer the signal electric charges to a direction that is 180 degrees different from another shift register and also can transfer the signal electric charges to a same direction as the another shift register continuously with the other shift register by changing driving of at least one of the shift registers, and output detecting devices.

3 Claims, 17 Drawing Sheets

US 7,586,133 B2

SOLID STATE IMAGING APPARATUS AND DRIVING METHOD OF SOLID STATE IMAGING APPARATUS

CROSS REFERENCE TO RELATED APPLICATION

This application is based on Japanese Patent Application 2005-092556, filed on Mar. 28, 2005, the entire contents of which are incorporated herein by reference.

BACKGROUND OF THE INVENTION

A) Field of the Invention

This invention relates to a solid state imaging apparatus, and more in detail, a driving method of a solid state imaging apparatus.

B) Description of the Related Art

FIG. 15 is a schematic view showing a structure of a conventional solid state imaging apparatus 10.

The solid state imaging apparatus 10 includes at least a multiplicity of photoelectric conversion elements (photodiodes) 11 arranged in two-dimension, a plurality columns of vertical electric charge transfer devices (vertical charge coupled device: VCCD) 12 vertically transferring signal electric charges generated in the photoelectric conversion elements 11, horizontal electric charge transfer devices (horizontal charge coupled device: HCCD) 14a and 14b positioned at a downstream end of the columns of the VCCD 12 and horizontally transferring the signal electric charges transferred by the VCCD12, and output amplifiers 15a and 15b detecting signals output from HCCD 14a and 14b respectively. The HCCD 14a and 14b have different transfer directions from a point where the number of the columns of the VCCD 12 is divided to about a half. Further, each of the VCCD 12 and the HCCD 14a and 14b is consisted of a charge coupled device (CCD).

The HCCD in the solid state imaging apparatus using a general electric charge coupled device transfers signal electric charges to one direction, and a single output amplifier corresponding to that will be prepared; however, this conventional solid state imaging apparatus equips with two HCCD 14a and 14b transferring to different directions for improvement in speed of reading cycle of the signal electric charges.

For example, driving waveforms φV1 to φV4 in the timing chart shown in FIG. 16 are imposed on each one of the V1 to V4 in the VCCD 12. The driving waveforms φV1 to φV4 are well-known four-phase driving type and read out the signal electric charges accumulated in the photoelectric conversion elements 11 to the VCCD 12 via a reading unit 3g corresponding to the amount of light irradiated to the solid state imaging apparatus 10.

The read signal electric charges are sequentially transferred to the direction of the HCCD 14 by sequentially imposing mid-level (VM) pulse or low-level (VL) pulse on the V1 to the V4 in the VCCD 12 during the transferring period.

The HCCD 14a and 14b sequentially and horizontally transfer the signal electric charges to the direction of the output amplifiers 15 by the well-known two-phase driving method. The transferred signal electric charges are detected by the output amplifiers 15a and 15b to generate output voltage corresponding to the amount of the irradiated light as the OS waveform.

Since the transfer operations by the above-described HCCD 14a and 14b are executed at the same time, the reading period will be about a half of that in the structure having only one HCCD, and the reading cycle can be shortened.

FIG. 17 is a schematic plan view of a border between the HCCD 14a and 14b including the vertical CCD (VCCD) 12 in the conventional solid state imaging apparatus shown in FIG. 15.

The VCCD 12 has a four-phase driving system, and the odd numbered electrodes V1 and V3 are consisted of the second layer electrodes 7, and the even numbered electrodes V2 and V4 are consisted of the first layer electrodes 6. The HCCD 14 (14a and 14b) consist an interface with the last electrodes of the VCCD 12 by the second layer electrodes 7 and temporally accumulate the signal electric charges in a channel 3 under the first layer electrodes 6 via this second layer electrodes.

FIG. 18 is a cross sectional view of a part cut across a line A-B in FIG. 17.

A well layer 2 having a reverse conductive type of the substrate is formed on the surface of the one conductive type semiconductor substrate 1, and impurity layers (transfer channels) 3 and 4 having a reverse conductive type of the well layer 2 are formed on the surface of the substrate in the well layer 2. The impurity layer 4 relatively composes thin impurity layer comparing to the impurity layer 3. The first electrode 6 is formed on the substrate 1 via an insulating layer 5, and the second electrode 7 is formed on the substrate 1 and a part of the first electrode 6 via the insulating layer 5. The impurity layer 3 under the electrode 6 and the impurity layer 4 under the electrode 7 are formed. The first electrode 7 and the second electrode 8 are electrically connected, and the well-known two-phase driving CCD operation is realized by the input shown in FIG. 19.

Connection of the electrodes in the first HCCD 14a is different from that in the second HCCD 14b. In the drawing, the H2 electrode 7 around the center in left and right directions is electrically connected with two electrodes 6 on left and right sides of the H2 electrode 7. Assuming those three electrodes as a center, on the left side of the drawing, the electrode 6 and the electrode 7 on the right side are electrically connected in the first HCCD 14a, and on the right side of the drawing, the electrode 6 and the electrode 7 on the left side are electrically connected in the second HCCD 14b.

FIG. 19 is a diagram for explaining a driving method of the first HCCD 14a and the second HCCD 14b in the conventional solid state imaging apparatus 10 shown in FIG. 15. In the drawing, a timing chart is on the left side, and an electric potential diagram of the impurity layers 3 and 4 in FIG. 18 corresponding to the timing chart is on the right side.

The signal electric charges transferred from the VCCD 12 are temporally accumulated in the impurity layer 3 under the electrode 6 via the impurity layer 4 under the electrode 7. The signal electric charges are transferred to the left direction by the HCCD 14a and to the right direction by the HCCD 14b by the well-known inverted clock movement of the φH1 and φH2 as shown in the timing chart.

FIG. 20 is a schematic plan view of a border between the HCCD 14a and 14b including the vertical CCD (VCCD) 12 in the conventional solid state imaging apparatus 20.

Structural difference from the conventional solid state imaging apparatus 10 shown in FIG. 17 and FIG. 18 is that the electrodes 7 and 8 of in the HCCD 14 corresponding to the number of horizontal columns of the transfer circuits in the VCCD 12 is half, that a line memory (LM) 13 is positioned at a connecting part between the VCCD 12 and the HCCD 14, and the electrical connection of the HCCD 14.

That is, in the electrodes except the boundary of the first HCCD 14a and the second HCCD 14b, the electrodes 7 and the electrodes 6 are alternatively arranged. When a combination of the electrode 6 and the electrode 7 is defined as one unit, the number of the columns (the pairs) is twice of the number of the columns of the VCCD 12 in the conventional solid state imaging apparatus 10; however, the number of the columns (the pairs) is the same as the number of the columns of the VCCD 12 in the conventional solid state imaging apparatus 20. This is because that the line memory (LM) 13 is installed at the connecting part between the VCCD 12 and the HCCD 14 (the first HCCD 14a and the second HCCD 14b). That is, when the line memory is installed, only the signal electric charges in the columns (H1) connected with the line memory 13 can selectively be read to the HCCD 14 by setting H1 of the HCCD electrode to high electric potential and H2 of the HCCD to low electric potential while setting a condition of the line memory 13 to change from high electric potential to low electric potential. Only the signal electric charges in the columns (H2) connected with the line memory 13 can selectively be read to the HCCD 14 by setting H2 of the HCCD electrode to high electric potential and H1 of the HCCD to low electric potential while setting the line memory 13 from a state of high electric potential to low electric potential after transferring the signal electric charges in the HCCD 14. Then, all the signal electric charges can be read by transferring the signal electric charges in the HCCD 14. By the way, the border electrode 6 between the first HCCD 14a and the second HCCD 14b is H3.

FIG. 21 is a cross sectional view of a part cut across a line A-B in FIG. 20.

A basic structure is the same as that of the solid state imaging apparatus 10 shown in FIG. 18, and explanation will be omitted. The difference from the solid state imaging apparatus 10 is that the border electrode 6 between the first HCCD 14a and the second HCCD 14b is independent as the H3 electrode.

FIG. 22A and FIG. 22B are diagrams for explaining a driving method of the first HCCD 14a and the second HCCD 14b in the conventional solid state imaging apparatus 20 shown in FIG. 20. In the drawing, a timing chart is on the left side, and an electric potential diagram of the impurity layers 3 and 4 in FIG. 21 corresponding to the timing chart is on the right side.

The signal charges transferred from the VCCD 12 are temporally accumulated in the impurity layer 3 under the electrode 6 via the impurity layer 4 under the electrode 7. The signal electric charges are transferred to the left direction by the HCCD 14a and to the right direction by the HCCD 14b by the well-known inverted clock movement of the φH1 and φH2 as shown in the timing chart.

The above-described conventional solid state imaging apparatuses 10 and 20 need to drive both of the first HCCD 14a and the second HCCD 14b for obtaining image information of the whole part of the imaging area in the solid state imaging apparatuses even if vertical thinning out (execution to read out by a few lines) is executed by the VCCD 12.

FIG. 23 is a schematic view of the peripheral circuit regarding to output of the solid state imaging apparatus. In the drawing, output from an amplifier 15a is OS1, and output from an amplifier 15b is OS2.

Each of the outputs OS1 and OS2 is input to a correction and synthesizing circuit 22 via an analogue front end (AFE) 21 including a current buffer, a CDS circuit and an A/D converter. Since the property of the outputs differ depending on the difference in a physical position of the amplifier and dispersion on manufacturing, the outputs OS1 and OS2 need to input to the correction circuit to unite both properties. The OS1 and OS2 are synthesized after the correction and are output to a storage/monitor 24 after converting to output for colorizing process, storage format and monitor format by a digital signal processor (DSP) 23.

Moreover, the details of the prior art can be found in Japanese Laid-Open Patent 2004-194023.

As described in the above, in the conventional solid state imaging apparatus equipped with two HCCD, two types of HCCD must be driven at anytime when all the signal electric charges are read out, or when, for example, signals for AE/AF is obtained by thinning out the vertical signals or horizontal signals at a time for using a digital still camera. Therefore, the output amplifiers having large power consumption in the solid state imaging apparatus are always driven in two lines, and the power consumption will be large.

Also, in processing an output signal, the two AFE 21 need to be operated in order to process the output of the two lines of output amplifiers. Moreover, since the correction circuit 22 needs to be operated, it will cause increase in power consumption on the peripheral circuit. Moreover, it is considered that degradation of S/N ratio may be caused by correction error of the two lines.

SUMMARY OF THE INVENTION

It is an object of the present invention to provide a solid state imaging apparatus that can decrease in the power consumption and equips with a horizontal electric charge transfer device that can transfer the signal electric charges to two directions.

It is another object of the present invention to provide a driving method of the solid state imaging apparatus that can decrease in the power consumption and equips with a horizontal electric charge transfer device that can transfer the signal electric charges to two directions.

According to one aspect of the present invention, there is provided a solid state imaging apparatus, comprising: a semiconductor substrate of one electric conductive type; a multiplicity of photoelectric conversion elements arranged on the semiconductor substrate in rows and columns, and each of which generates a signal electric charge corresponding to incident rays; a vertical electric charge transferring device that is arranged between the columns of the photoelectric conversion elements in a vertical direction and transfers the signal electric charges generated by the photoelectric conversion elements; a horizontal electric charge transferring device that temporarily stores the signal electric charges transferred from the vertical electric charge transferring device and transfers the signal electric charges to a horizontal direction in a sequential order, wherein the horizontal electric charge transferring device comprises at least two lines of horizontal shift registers and an electrode structure with which one shift register can transfer the signal electric charges to a direction that is 180 degrees different from another shift register and also can transfer the signal electric charges to a same direction as the another shift register continuously with the other shift register by changing driving of at least one of the shift registers; and output detecting devices that detect the signal electric charges transferred by the horizontal electric charge transferring device.

According to the present invention, a solid state imaging apparatus that can decrease in the power consumption and equips with a horizontal electric charge transfer device that can transfer the signal electric charges to two directions can be provided.

According to the present invention, a driving method of the solid state imaging apparatus that can decrease in the power consumption and equips with a horizontal electric charge transfer device that can transfer the signal electric charges to two directions can be provided.

DETAILED DESCRIPTION OF THE PREFERRED EMBODIMENTS

Figure 1:
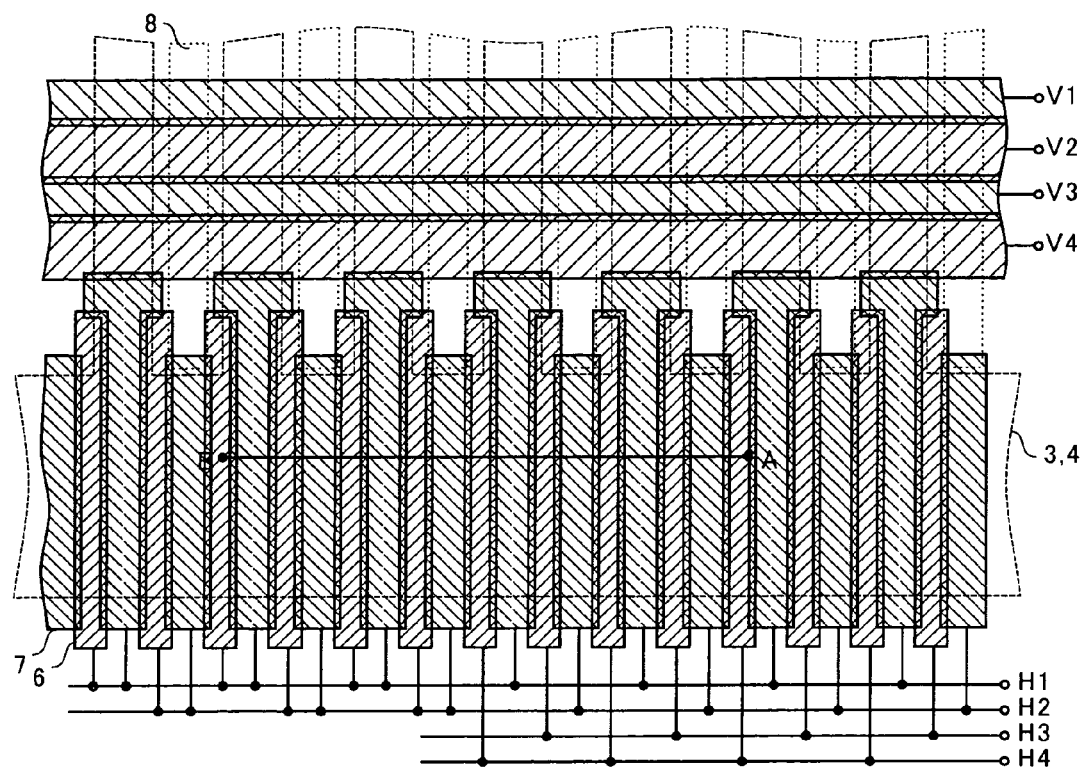
FIG. 1 is a schematic plan view of a border between the HCCD 14a and 14b including the vertical CCD (VCCD) 12 in the solid state imaging apparatus according to a first embodiment of the present invention.

FIG. 1 is a schematic plan view of a border between the HCCD 14a and 14b and its vicinity including the vertical CCD (VCCD) 12 in the solid state imaging apparatus 1 according to a first embodiment of the present invention.

The solid state imaging apparatus 1 includes at least a multiplicity of photoelectric conversion elements (photodiodes) 11 arranged in two-dimension, each of the photoelectric conversion element generating and accumulating a signal electric charge corresponding to incident rays, a plurality columns of vertical electric charge transfer devices (vertical charge coupled device: VCCD) 12 vertically transferring the signal electric charges generated and accumulated in the photoelectric conversion elements 11, horizontal electric charge transfer devices (horizontal charge coupled device: HCCD) 14a and 14b positioned at downstream end of the columns of the VCCD 12 and horizontally transferring the signal electric charges transferred by the VCCD 12, and output amplifiers 15a and 15b detecting signals output from HCCD 14a and 14b respectively. The HCCD 14a and 14b have different transfer directions from a point where the number of the columns of the VCCD 12 is divided to about a half. Further, each of the VCCD 12 and the HCCD 14a and 14b is consisted of a charge coupled device (CCD).

Figure 15:
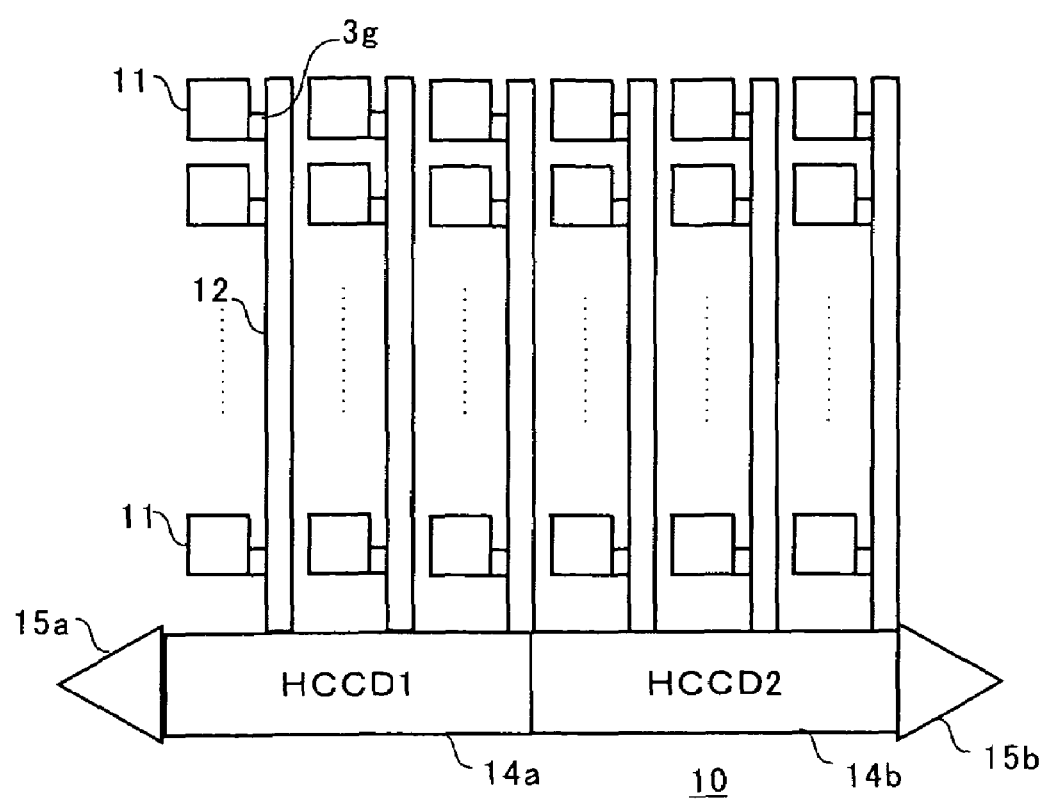
FIG. 15 is a schematic plan view showing a structure of a conventional solid state imaging apparatus 10.
Figure 16:
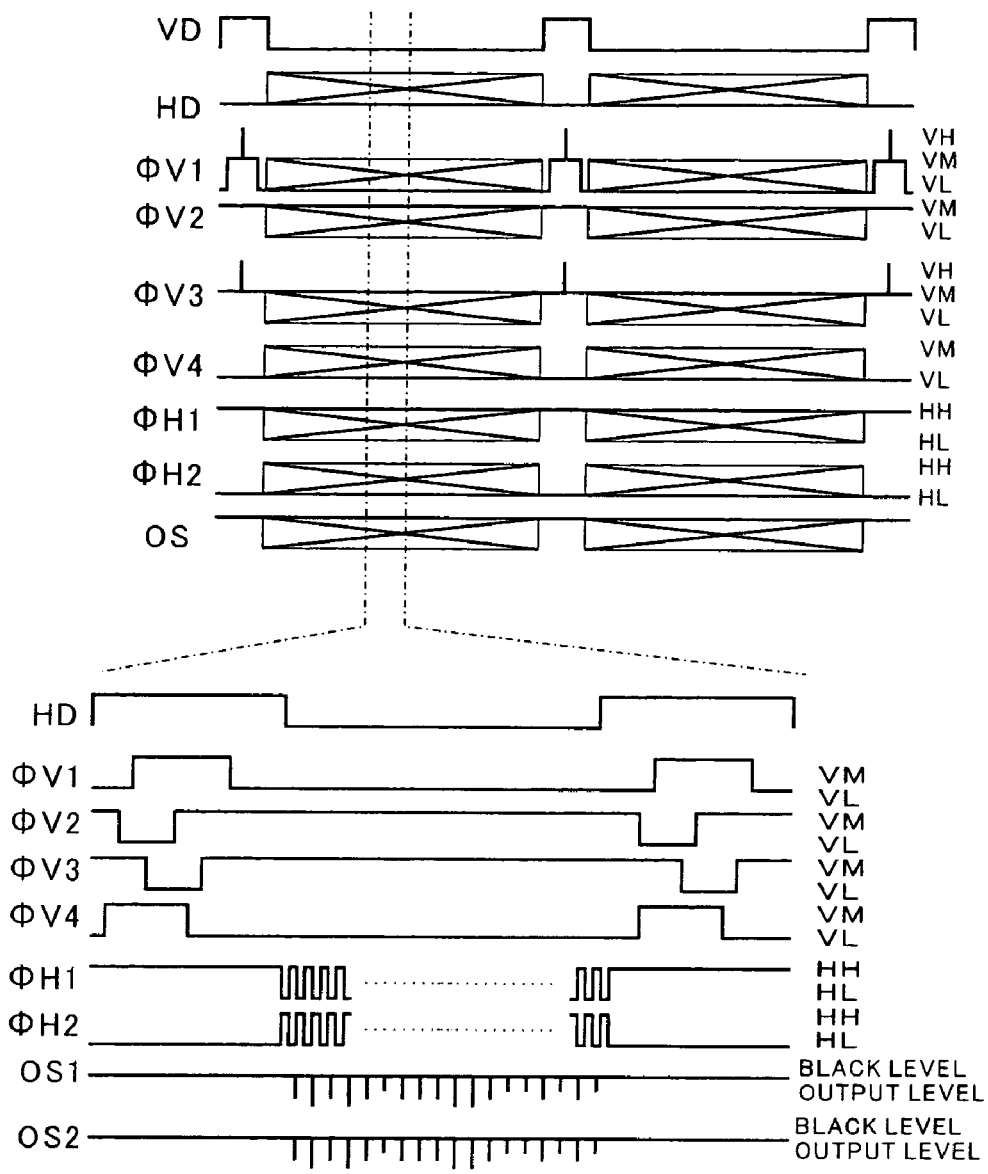
FIG. 16 is a driving timing chart of the conventional solid state imaging apparatus 10 shown in FIG. 15.

The solid state imaging apparatus 1 according to the embodiments of the present invention has a similar structure as the conventional solid state imaging device shown in FIG. 15 other than an electrode structure of the HCCD 14 (HCCD 14a and HCCD 14b) and driving pulses pf four phases (φH1 to φH4) are imposed to the HCCD 14 (HCCD 14a and HCCD 14b). Therefore, the well-known technique can be used for the components similar to the conventional apparatus.

A main feature of the electro rode structure according to the first embodiment is that, when the number of the columns of the photodiodes 11 is divided into half, an arrangement of the electrode in an order of "H2, H1" is repeated from the center to the edge (from center to the left edge in the drawing) with electrically connecting the electrodes 6 and electrode 7 and defining them as one pair of electrodes in the first HCCD 14a positioned from the center to the left side, and that an arrangement of the electrode in an order of "H4, $H_1$, H3, H2" is repeated from the center to the edge (from center to the right edge in the drawing) with electrically connecting the electrodes 6 and electrode 7 and defining them as one pair of electrodes in the second HCCD 14b positioned from the center to the right side.

The explanations for the structures other than the above-described electrode arrangements of the HCCD 14a and the HCCD 14b and the timing of the driving waveform described later are omitted because the structures explained as the conventional technique can be properly used.

Figure 2:
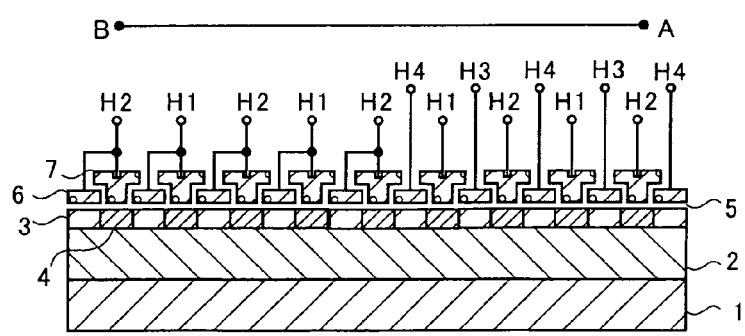
FIG. 2 is a cross sectional view of a part cut across a line A-B in FIG. 1.

FIG. 2 is a cross sectional view of a part of the solid state imaging apparatus 1 cut across a line A-B in FIG. 1

A well layer 2 having a reverse conductive type of the substrate is formed on the surface of the one conductive type semiconductor substrate 1, and impurity layers (transfer channels) 3 and 4 having a reverse conductive type of the well layer 2 are formed on the surface of the substrate in the well layer 2. The impurity layer 4 relatively composes thin impurity layer comparing to the impurity layer 3. The first electrode 6 is formed on the substrate 1 via an insulating layer 5, and the second electrode 7 is formed on the substrate 1 and a part of the first electrode 6 via the insulating layer 5. The impurity layer 3 under the electrode 6 and the impurity layer 4 under the electrode 7 are formed.

Figure 3A:
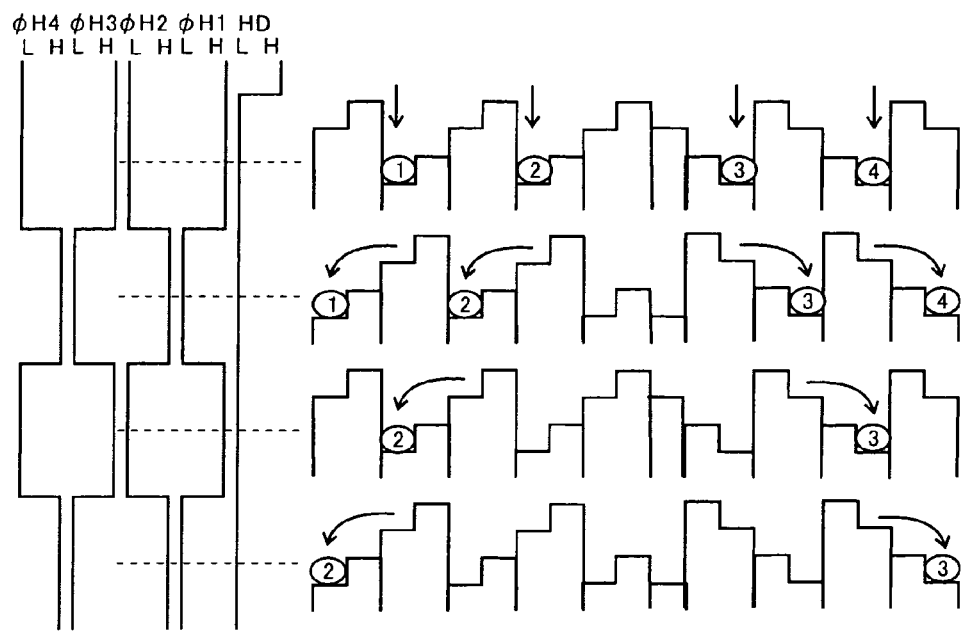
FIG. 3A and FIG. 3B are timing charts at a time of executing horizontal pixel addition by eight-phase driving of the HCCD 14 and movement of the signal electric charges according to the first embodiment of the present invention.
Figure 3B:
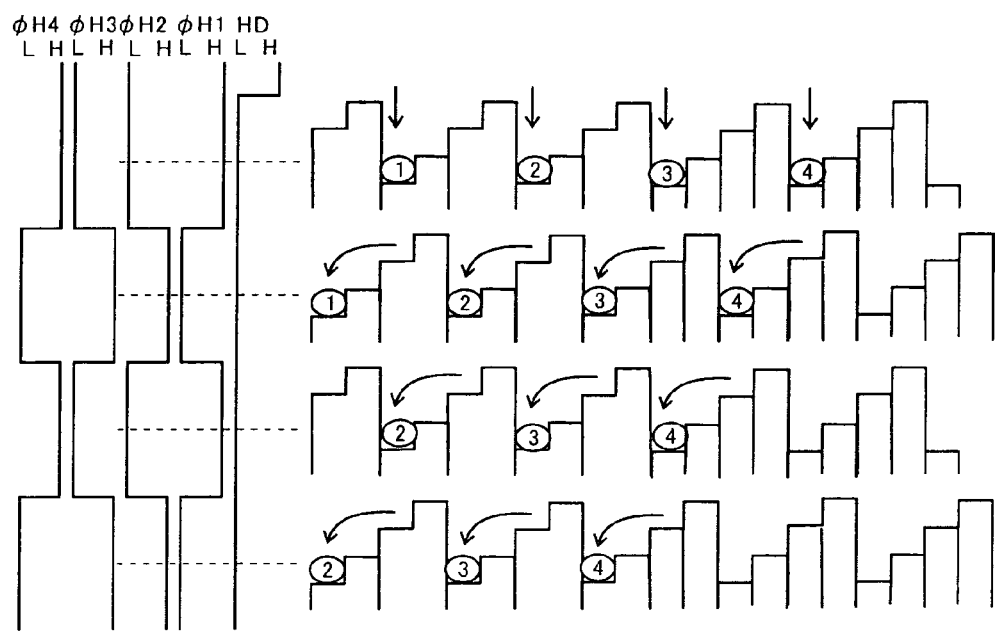

FIG. 3A and FIG. 3B are diagrams for explaining a driving method of the first HCCD 14a and the second HCCD 14b according to the first embodiment of the present invention. In the drawings, timing charts are on the left side, and electric potential diagrams of the impurity layers 3 and 4 in FIG. 2 corresponding to the timing charts are on the right side.

FIG. 3A is a diagram for explaining the driving method when the signal electric charges are transferred to two different directions (e.g., left and right) by using the first HCCD 14a and the second HCCD 14b.

The signal electric charges transferred from the VCCD 12 are temporally accumulated in the impurity layer 3 under the electrode 6. Then, as shown in the timing chart the signal charges are transferred to the left direction by the HCCD 14a and to the right direction by the HCCD 14b by the inverted clock movement wherein φH1 and φH3 are defined as one unit, and φH2 and φH4 are defined as another unit.

FIG. 3B is a diagram for explaining the driving method when the signal charges are transferred to one direction (for example, to the left direction in the drawing) by using the first HCCD 14a and the second HCCD 14b.

The signal electric charges transferred from the VCCD 12 are temporally accumulated in the impurity layer 3 under the electrode 6. Then, as shown in the timing chart, the signal charges are transferred to the left direction by both of the HCCD 14a the HCCD 14b by the inverted clock movement wherein φH1 and φH4 are defined as one unit, and φH2 and φH3 are defined as another unit.

Figure 4:
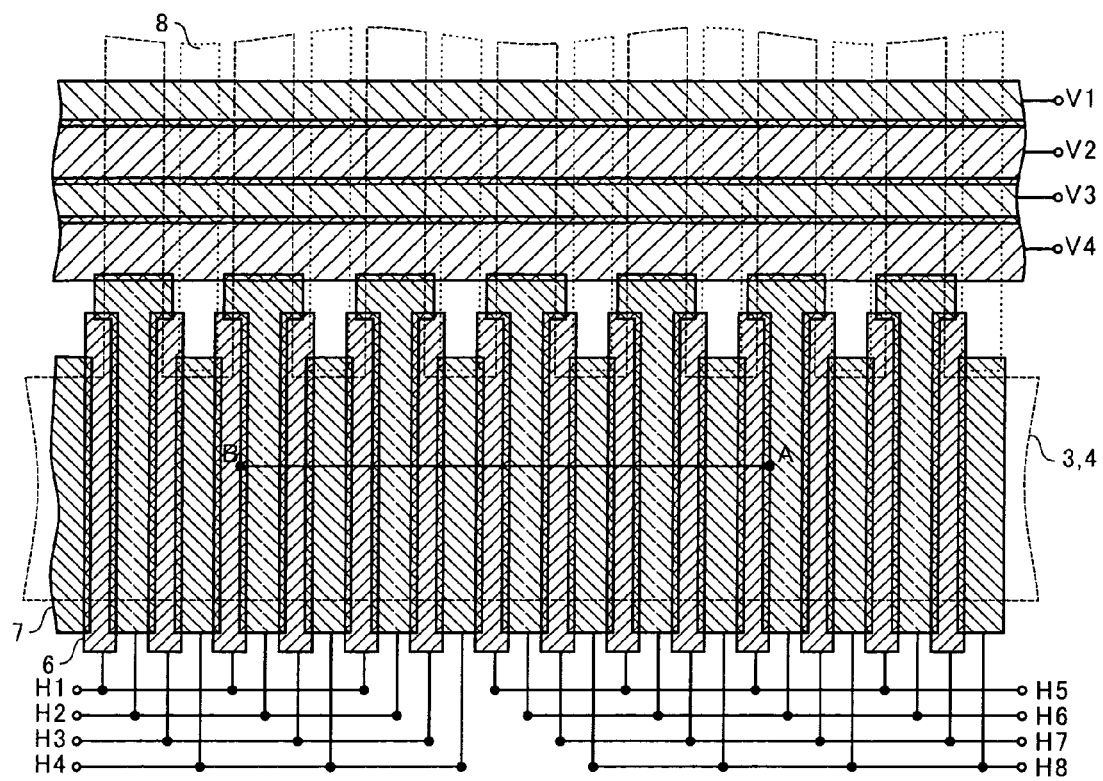
FIG. 4 is a schematic plan view of a border between the HCCD 14a and 14b including the vertical CCD (VCCD) 12 in the solid state imaging apparatus according to a modified example of the first embodiment of the present invention
Figure 17:
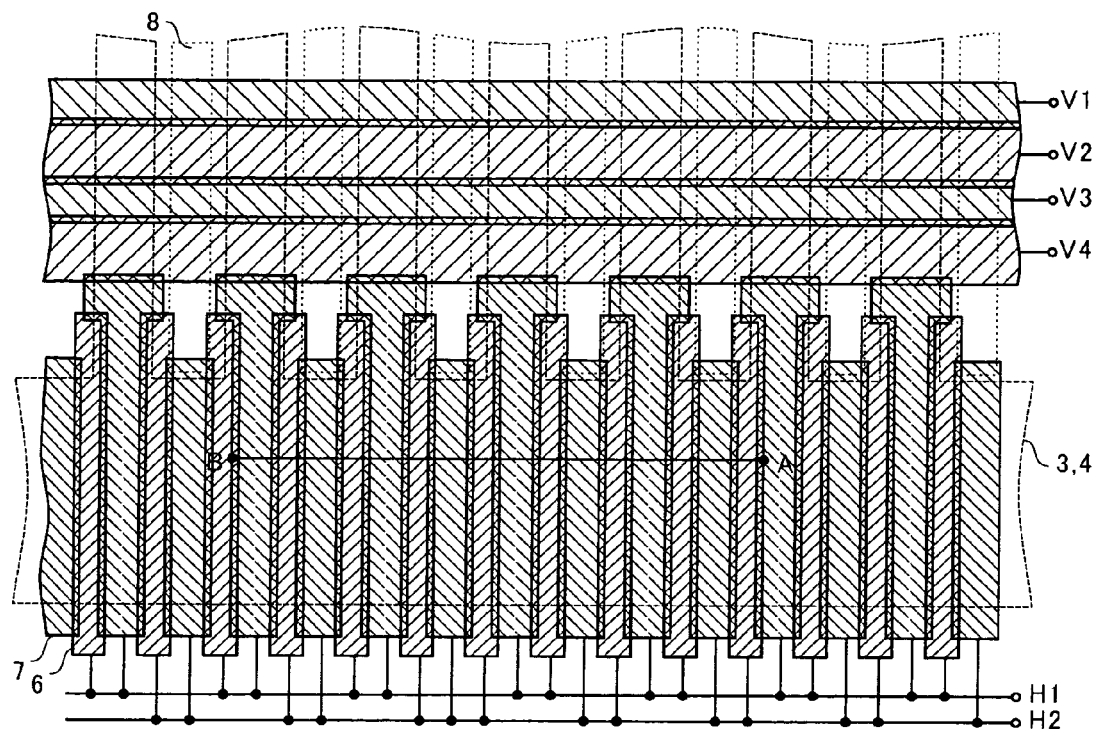
FIG. 17 is a schematic plan view of a border between the HCCD 14a and 14b including the vertical CCD (VCCD) 12 in the conventional solid state imaging apparatus 10 shown in FIG. 15.
Figure 18:
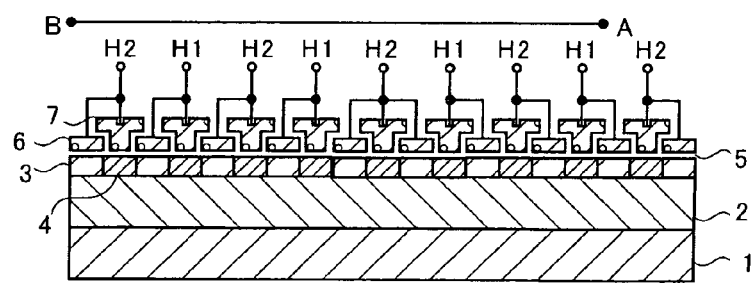
FIG. 18 is a cross sectional view of a part indicated with a line A-B in FIG. 17.
Figure 19:
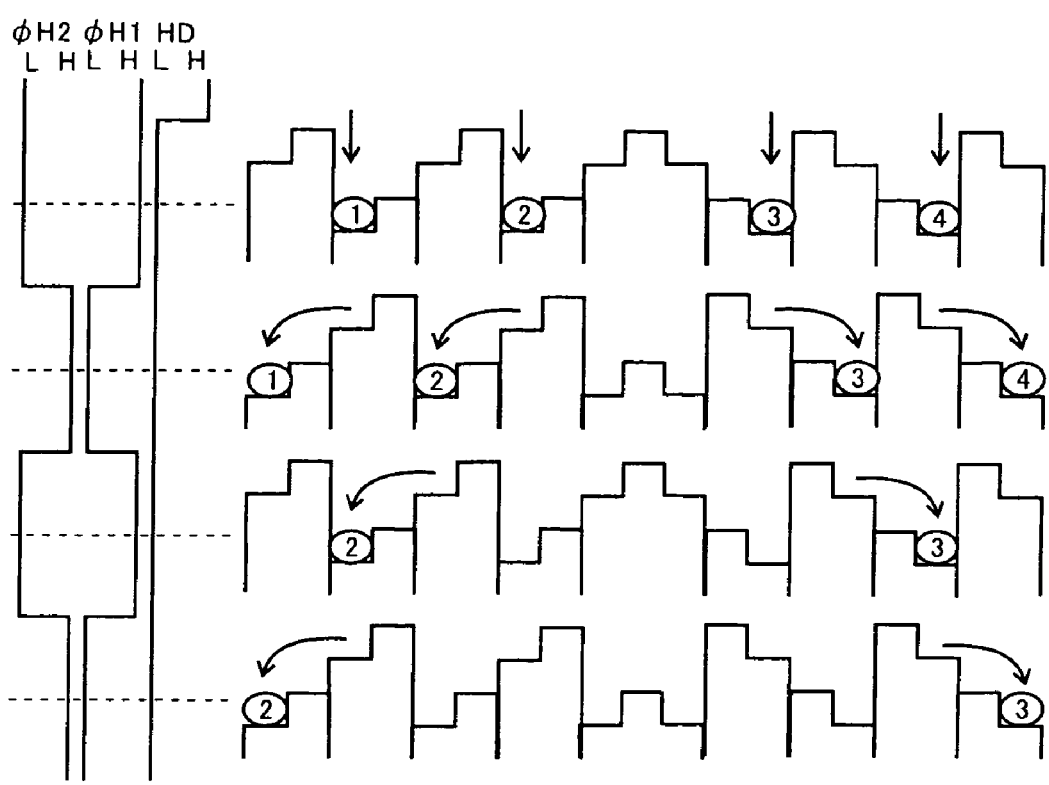
FIG. 19 is a diagram for explaining the drive of the first HCCD 14a and the second HCCD 14b in the conventional solid state imaging apparatus 10 shown in FIG. 15.

FIG. 4 is a schematic plan view of a border between the HCCD 14a and 14b and a vicinity of the border including the vertical CCD (VCCD) 12 in the solid state imaging apparatus according to a modified example of the first embodiment of the present invention. Moreover, it is the same as the conventional technique in FIG. 17 and the first embodiment shown in FIG. 1 except that the eight-phase (φH1 to φH8) driving pulses are imposed on the HCCD 14 and that its electrode structure is changed. That is, the structure other than the HCCD 14 such as the VCCD 12 is the same as the conventional technique, and therefore the well-known technique can be used.

One feature of the electrode structure according to a modified example of the first embodiment is that the electrode 6 and the electrode 7 are electrically wired independently, and an electrode arrangement in an order of "H4, H3, H2, H1" is repeated from the center to the edge (from the center to the left edge in the drawing) in the first HCCD 14a positioned at the center to the left when the number of columns of the photodiodes 11 are divided into a half. Another feature is that the electrode 6 and the electrode 7 are wired independently, and an electrode arrangement in an order of "H5, H6, H7, H8" is repeated from the center to the edge (from the center to the right edge in the drawing) in the second HCCD 14b positioned at the center to the right.

Figure 5:
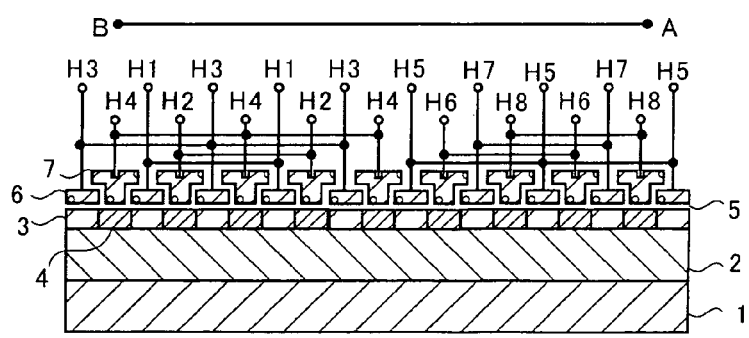
FIG. 5 is a cross sectional view of a part cut across a line A-B in FIG. 4.

Moreover, the structure explained as the conventional technique can properly be used except the above-described electrode arrangements of the HCCD 14a and HCCD 14b and the timing of the driving waveform described later; therefore, the explanations for the similar components are omitted. Also, the cross sectional structure shown in FIG. 5 is the same as that shown in FIG. 2 other than the electrode structure described in the above, and therefore the explanation is omitted.

Figure 6A:
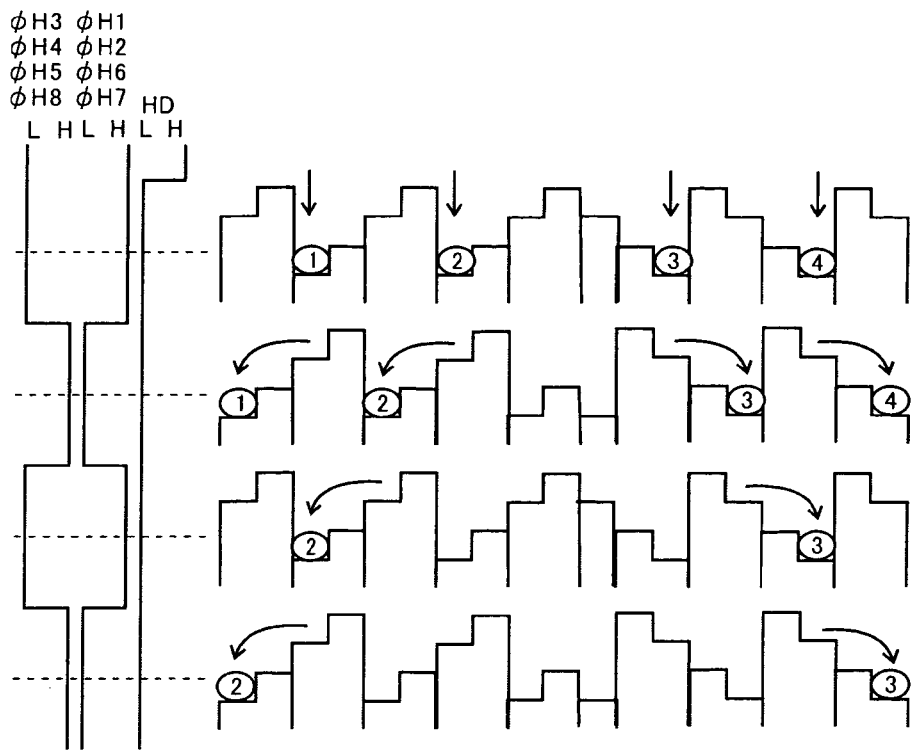
FIG. 6A and FIG. 6B are timing charts for explaining a driving method of the first HCCD 14a and the second HCCD 14b according to a modified example of the first embodiment of the present invention.
Figure 6B:
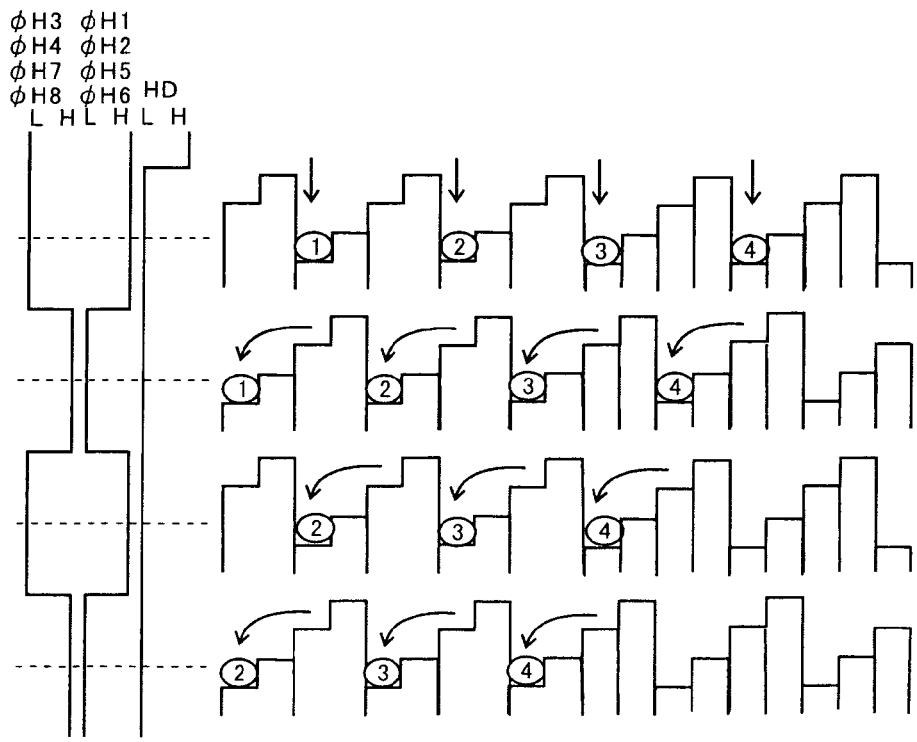

FIG. 6A and FIG. 6B are diagrams for explaining a driving method of the first HCCD 14a and the second HCCD 14b according to a modified example of the first embodiment of the present invention. In the drawings, timing charts are on the left side, and electric potential diagrams of the impurity layers 3 and 4 in FIG. 5 corresponding to the timing charts are on the right side.

FIG. 6A is a diagram for explaining the driving method when the signal electric charges are transferred to two different directions (e.g., left and right) by using the first HCCD 14a and the second HCCD 14b.

The signal electric charges transferred from the VCCD 12 are temporally accumulated in the impurity layer 3 under the electrode 6. Then, as shown in the timing chart the signal charges are transferred to the left direction by the HCCD 14a and to the right direction by the HCCD 14b by the inverted clock movement wherein φH1, φH2, φH6 and φH7 are defined as one unit, and φH3, φH4, φH5 and φH8 are defined as another unit.

FIG. 6B is a diagram for explaining the driving method when the signal electric charges are transferred to one direction (for example, to the left direction or right direction in the drawing) by using the first HCCD 14a and the second HCCD 14b.

The signal electric charges transferred from the VCCD 12 are temporally accumulated in the impurity layer 3 under the impurity layer 4 under the electrode 7. Then, as shown in the timing chart, the signal charges are transferred to the left direction by the both of the HCCD 14a and the HCCD 14b by the inverted clock movement wherein φH1, φH2, φH5 and φH6 are defined as one unit, and φH3, φH4, φH7 and φH8 are defined as another unit. Also, the signal electric charges can be transferred to the right direction by the both of the HCCD 14a and the HCCD 14b by the invert clock movement wherein φH2, φH3, φH6 and φH7 are defined as one unit, and φH1, φH4, φH5 and φH8 are defined as another unit. A reflective image (mirror image) can be generated by transferring to the right direction, and for example, it can be used for a picture to be projected on a rear view mirror equipped on a car.

Figure 7:
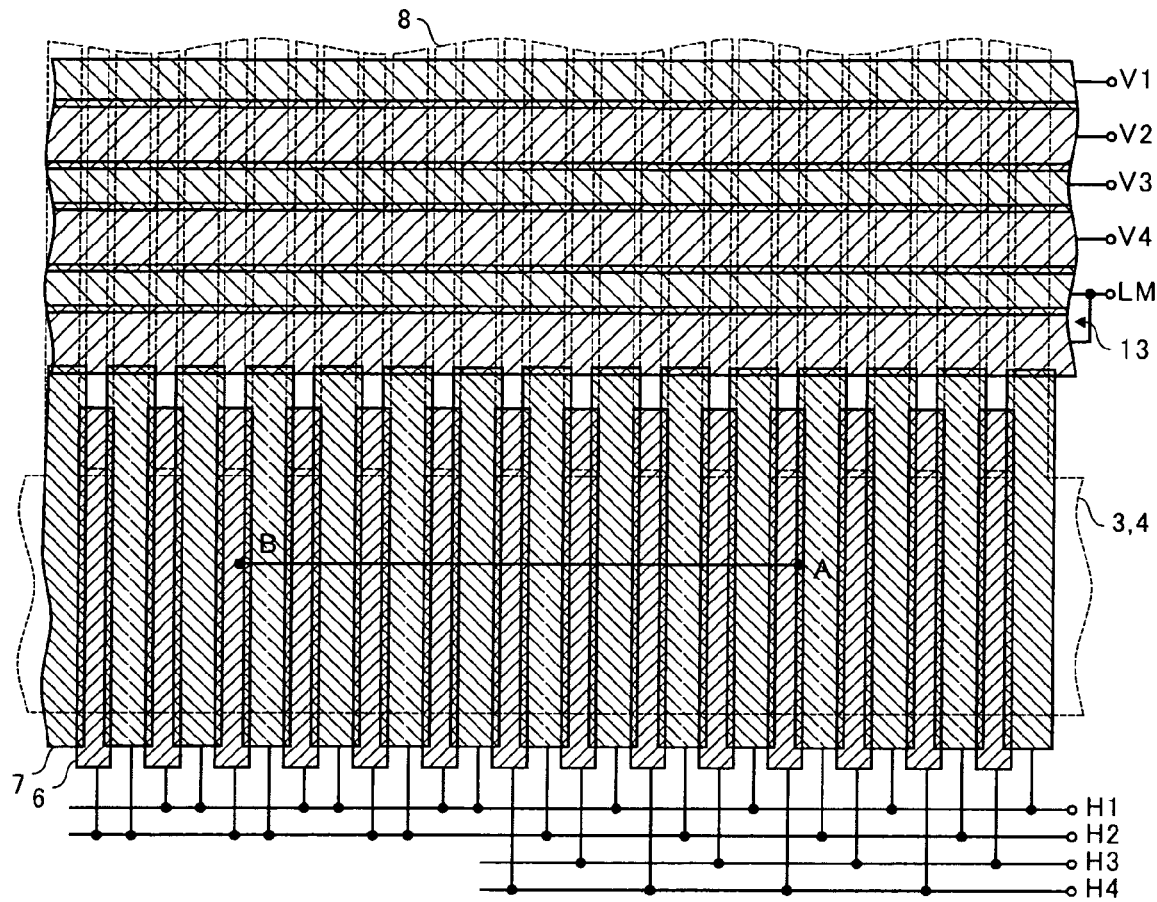
FIG. 7 is a schematic plan view of a border between the HCCD 14a and 14b including the vertical CCD (VCCD) 12 in the solid state imaging apparatus according to a second embodiment of the present invention
Figure 20:
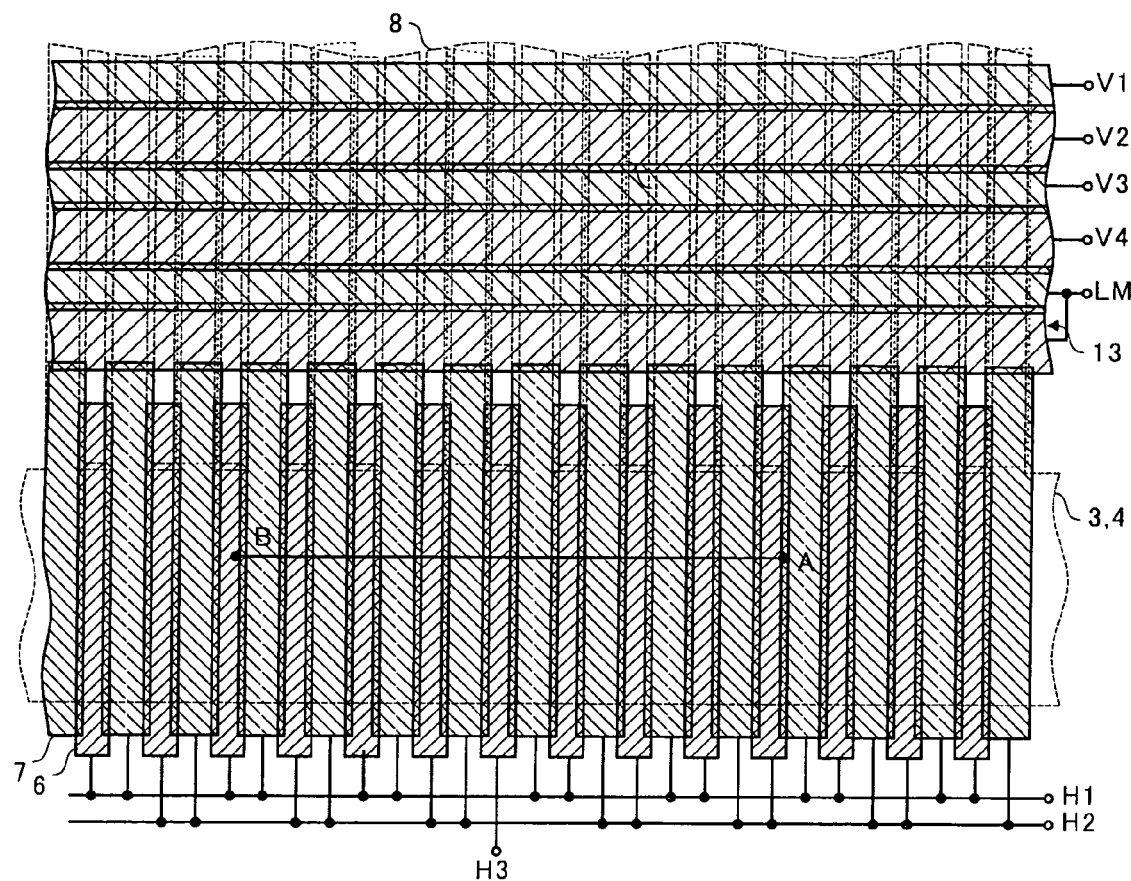
FIG. 20 is a schematic plan view of a border between the HCCD 14a and 14b including the vertical CCD (VCCD) 12 in the conventional solid state imaging apparatus 20.
Figure 21:
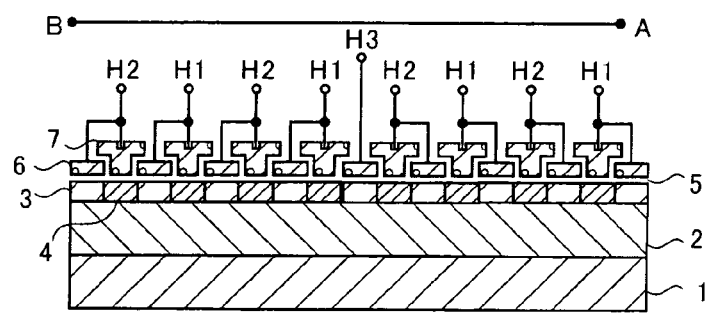
FIG. 21 is a cross sectional view of a part indicated with a line A-B in FIG. 20.
Figure 22A:
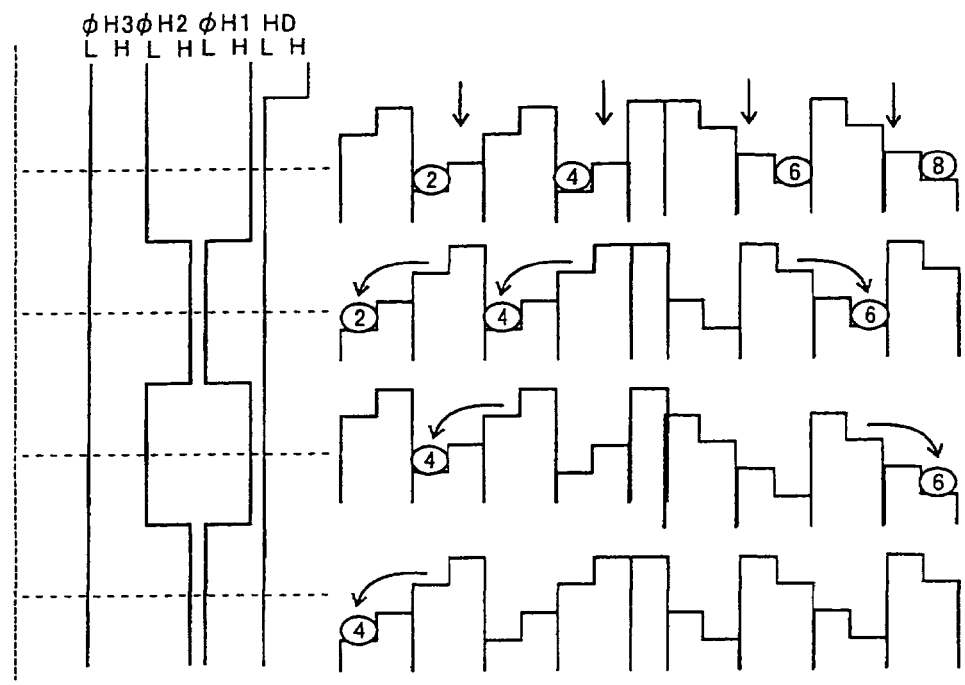
FIG. 22A and FIG. 22B are diagrams for explaining the drive of the first HCCD 14a and the second HCCD 14b in the conventional solid state imaging apparatus 20 shown in FIG. 20.
Figure 22B:
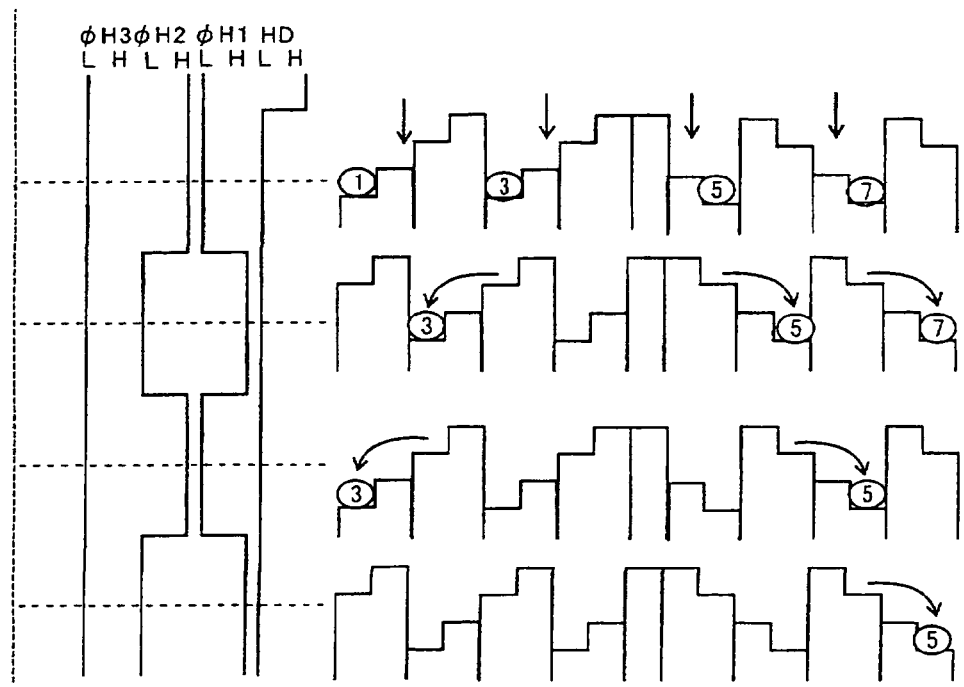
Figure 23:
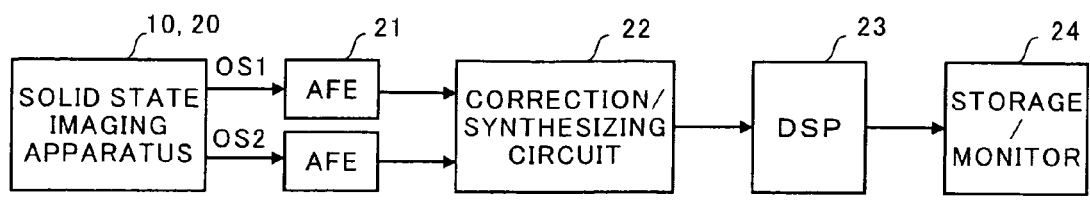
FIG. 23 is a schematic view of the peripheral circuit regarding to output of the solid state imaging apparatus.

FIG. 7 is a schematic plan view of a border between the HCCD 14a and 14b and its vicinity including the vertical CCD (VCCD) 12 in the solid state imaging apparatus according to a second embodiment of the present invention. Moreover, it is the same as the conventional technique equipped with the line memory 13 shown in FIG. 20 except that four-phase (φH1 to φH4) driving pulses are imposed on the HCCD 14 and an electrode structure is changed. That is, the structure other than the VCCD 12 and the HCCD 14 such as the line memory 13 is the same as the conventional technique, and the well-known technique can be used.

A main feature of the electrode structure according to the second embodiment is that an electrode arrangement in an order of "H1, H2" is repeated from the center to the edge (from the center to the left edge in the diagram) wherein the electrode 6 and the electrode 7 are defined as one unit of electrode by electrically connecting with each other in the first HCCD 14a positioned at the center to the left side when the number of the photodiode 11 are divided into about a half. Another feature is that an electrode arrangement in an order of "H4, H2, H3, H1" is repeated from the center to the edge (from the center to the right edge in the diagram) wherein the electrode 6 and the electrode 7 electrically wired independently from each other in the second HCCD 14b positioned at the center to the right side.

Figure 8:
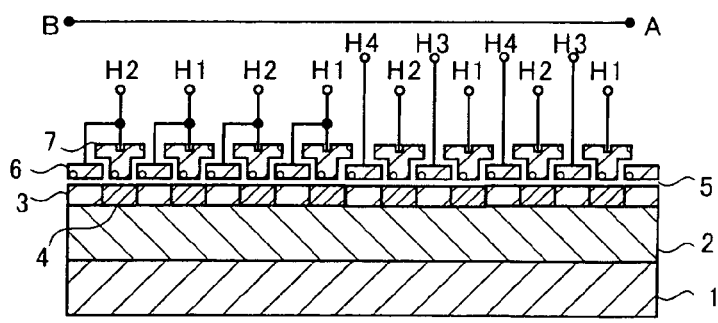
FIG. 8 is a cross sectional view of a part cut across a line A-B in FIG. 7.

Moreover, the structure for the structure explained as the conventional technique except the above-described electrode arrangements of the HCCD 14a and HCCD 14b and the timing of the driving waveform described later can be properly used, and the explanations for them are omitted. The cross sectional structure shown in FIG. 8 is also the same as those shown in FIG. 2 and FIG. 5 except the above-described electrode structure although pitches of each electrode are different, and the explanations for the cross sectional structure is omitted.

Figure 9A:
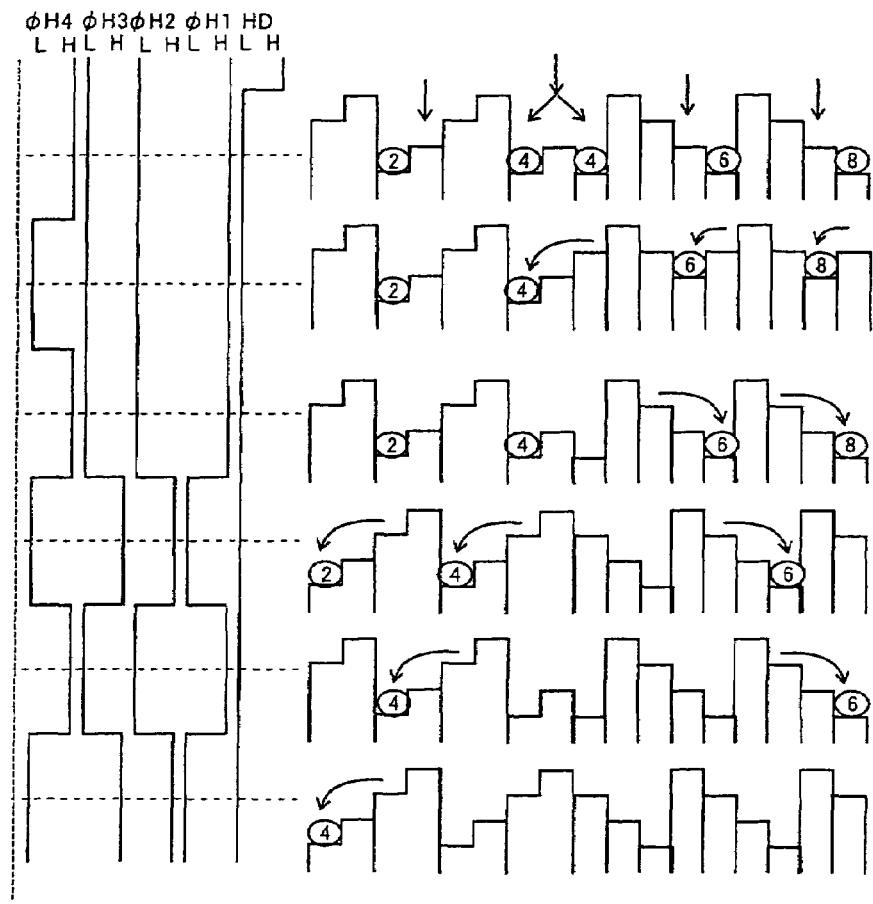
FIG. 9A and FIG. 9B are diagrams for explaining a driving method at a time that the signal electric charges are transferred to two directions of left and right by using the first HCCD 14a and the second HCCD 14b according to the second embodiment of the present invention.
Figure 9B:
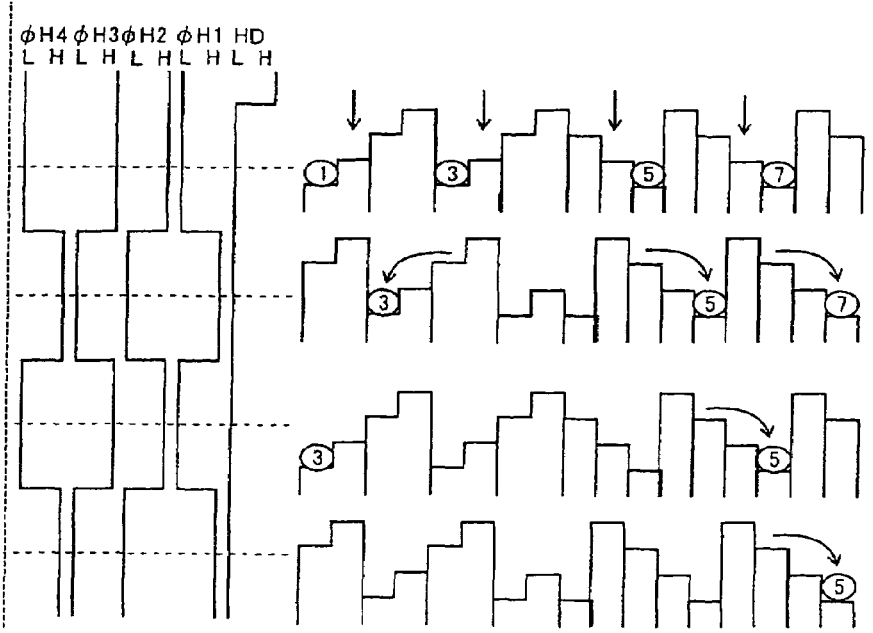

FIG. 9A and FIG. 9B are diagrams for explaining a driving method when the signal electric charges are transferred to two directions, left and right, by using the first HCCD 14a and the second HCCD 14b according to the second embodiment of the present invention. In the drawings, timing charts are on the left side, and electric potential diagrams of the impurity layers 3 and 4 in FIG. 8 corresponding to the timing charts are on the right side.

The signal electric charges transferred from the VCCD 12 are accumulated in the impurity layer 3 under the electrode 6 via the impurity layer 4 under the electrode 7. Then, as shown in the electric potential diagram, the signal electric charges positioned in the center part are divided and accumulated under the H1 electrode and under the H4 electrode at first. As shown in the timing chart, the signal electric charges under the H4 electrode are moved to under the H1 electrode by imposing the low voltage on φH4 first. After that, the signal electric charges are transferred to the left direction by the HCCD 14a and to the right direction by the HCCD 14b by the inverted clock movement wherein φH1 and φH4 are defined as one unit, and φH2 and φH3 are defined as another unit.

Figure 10A:
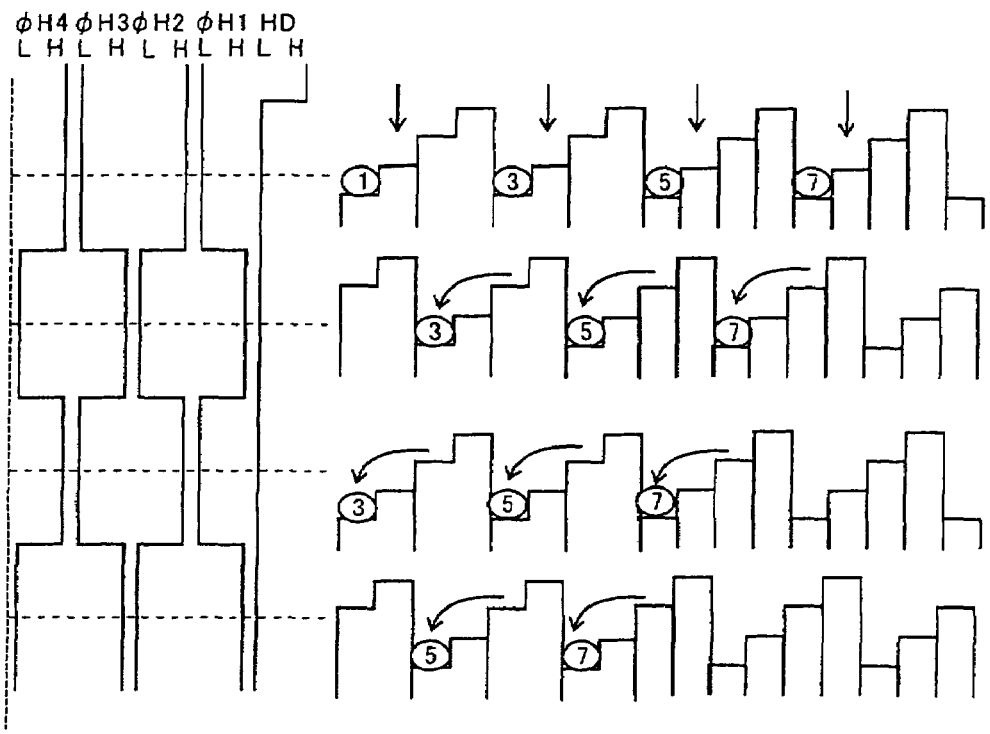
FIG. 10A and FIG. 10B are diagrams for explaining a driving method when the signal electric charges are transferred to one direction (for example, to the left direction in the diagram) by using the first HCCD 14a and the second HCCD 14b according to the second embodiment of the present invention.
Figure 10B:
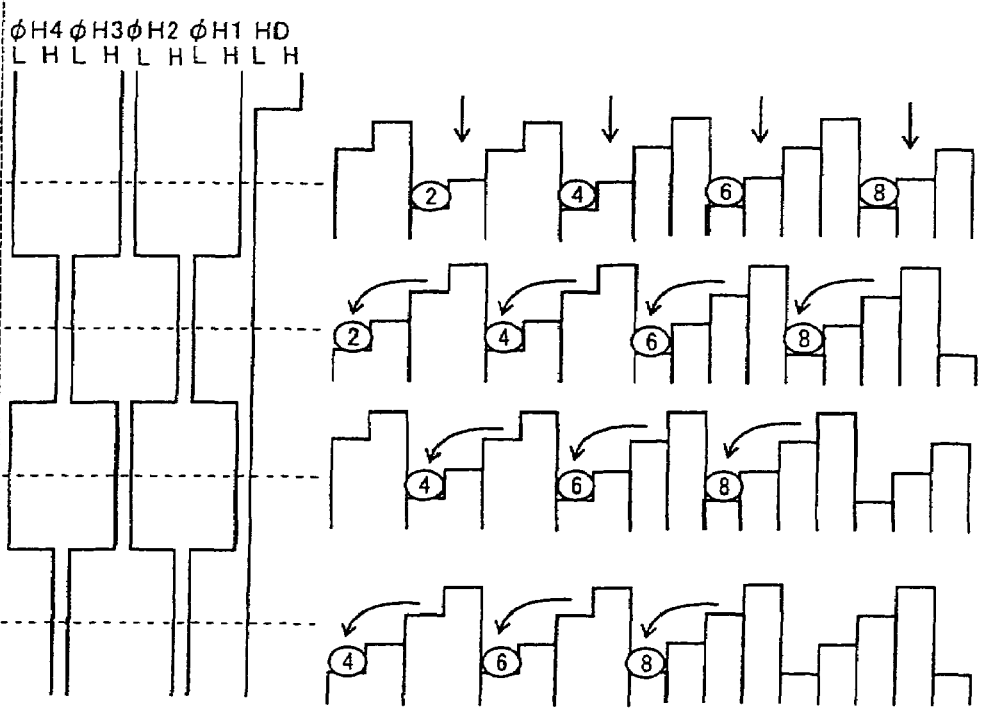

FIG. 10A and FIG. 10B are diagrams for explaining a driving method when the signal electric charges are transferred to one direction (for example, to the left direction in the diagram) by using the first HCCD 14a and the second HCCD 14b according to the second embodiment of the present invention. In the drawings, timing charts are on the left side, and electric potential diagrams of the impurity layers 3 and 4 in FIG. 8 corresponding to the timing charts are on the right side.

The signal electric charges transferred from the VCCD 12 are temporally accumulated in the impurity layer 3 under the electrode 6 via the impurity layer 4 under the electrode 7. Then, as shown in the timing chart, the signal charges are transferred to the left direction by both of the HCCD 14a and the HCCD 14b by the inverted clock movement wherein φH1 and φH3 are defined as one unit, and φH2 and φH4 are defined as another unit.

Figure 11:
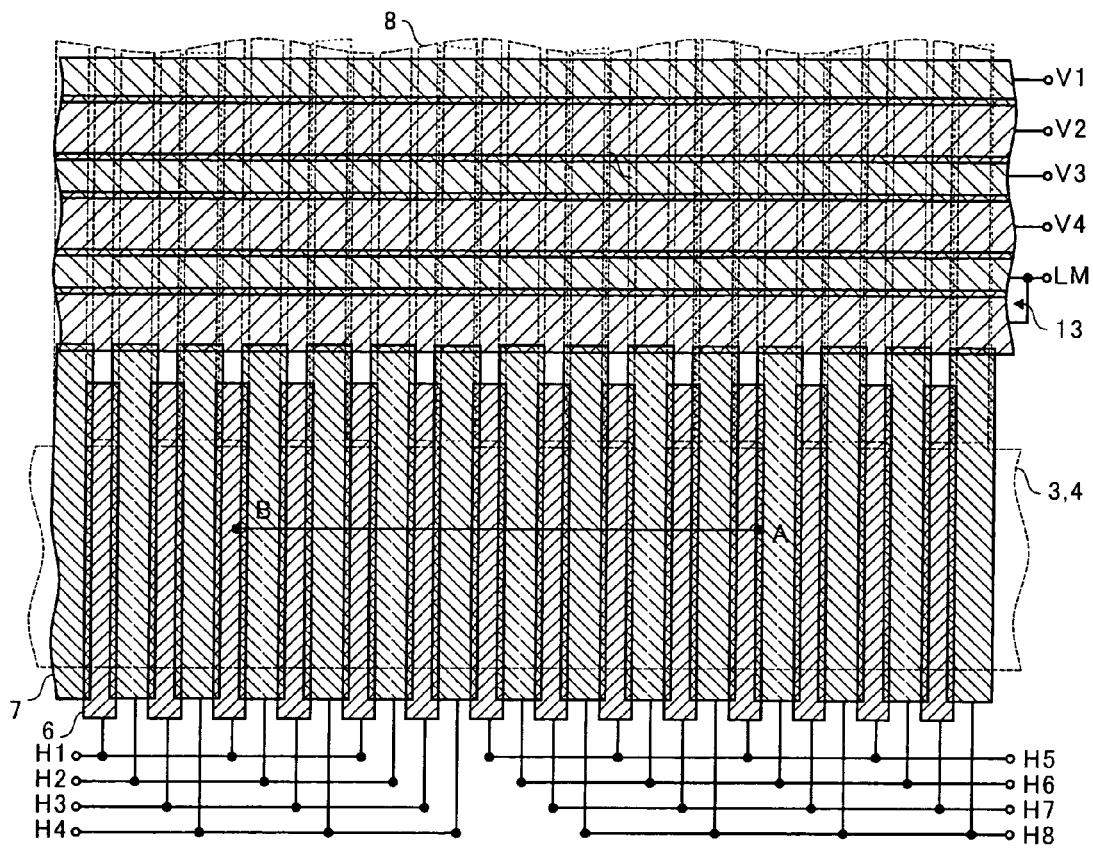
FIG. 11 is a schematic plan view of a border between the HCCD 14a and 14b including the vertical CCD (VCCD) 12 in the solid state imaging apparatus according to a modified example of the second embodiment of the present invention

FIG. 11 is a schematic plan view of a border between the HCCD 14a and 14b and its vicinity including the vertical CCD (VCCD) 12 in the solid state imaging apparatus according to a modified example of the second embodiment of the present invention. Moreover, it is the same as the conventional technique and the second embodiment shown in FIG. 7 except that eight-phase (φH1 to φH8) driving pulses are imposed on the HCCD 14 and the electrode structure is changed. That is, the structure except the VCCD 12 and the HCCD 14 is the same as the conventional technique, and the well-known technique can be used for the similar components.

A main feature of the electrode structure according to the embodiment is that an electrode arrangement in an order of "H4, H3, H2, H1" is repeated from the center to the edge (from the center to the left edge in the drawing) wherein the electrode 6 and the electrode 7 electrically wired independently from each other in the first HCCD 14a positioned at the center to the left side when the number of the photodiode 11 are divided into about two. Another feature is that an electrode arrangement in an oder of "H5, H6, H7, H8" is repeated from the center to the edge (from the center to the right edge in the drawing) wherein the electrode 6 and the electrode 7 electrically wired independently from each other in the second HCCD 14b positioned at the center to the right side.

Figure 12:
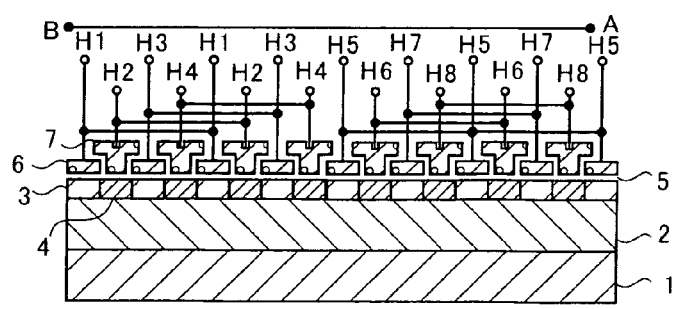
FIG. 12 is a cross sectional view of a part indicated with A to B in FIG. 11.

Moreover, the structure for the structure explained as the conventional technique except the above-described electrode arrangements of the HCCD 14a and HCCD 14b and the timing of the driving waveform described later can be properly used, and the explanations for them are omitted. The cross sectional structure shown in FIG. 12 is also the same as those shown in FIG. 2, FIG. 5 and FIG. 8 except the above-described electrode structure, and the explanations for the cross sectional structure is omitted.

Figure 13A:
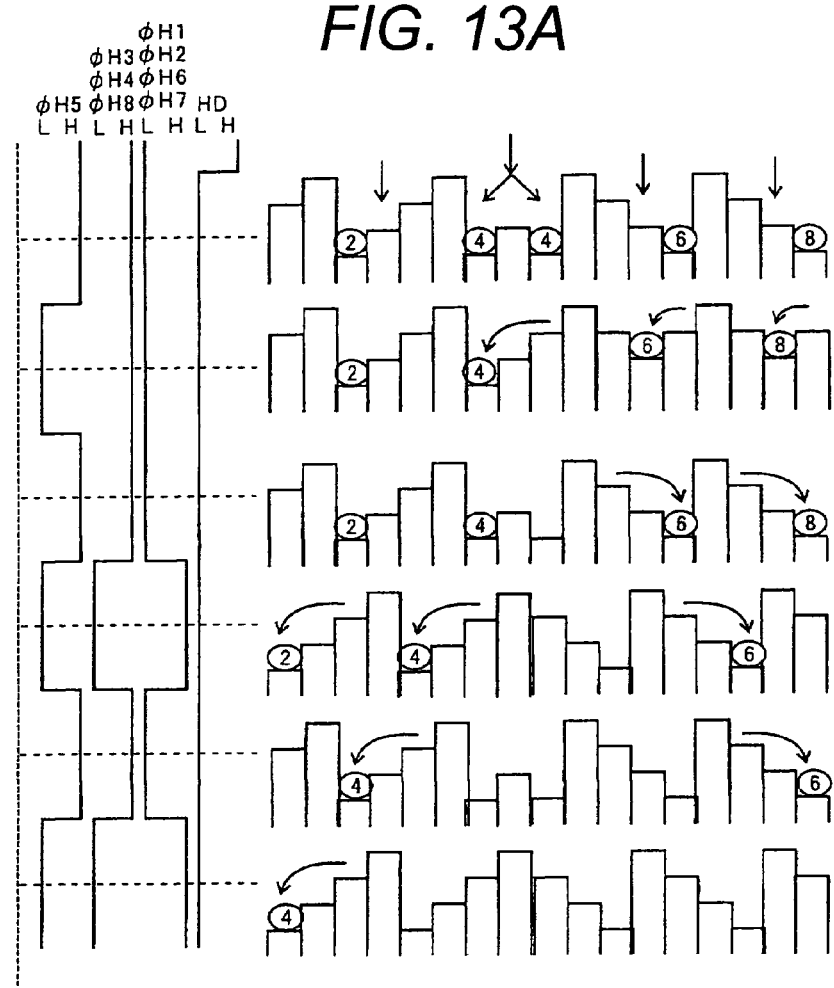
FIG. 13A and FIG. 13B are diagrams for explaining a driving method at a time that the signal electric charges are transferred to two directions of left and right by using the first HCCD 14a and the second HCCD 14b.
Figure 13B:
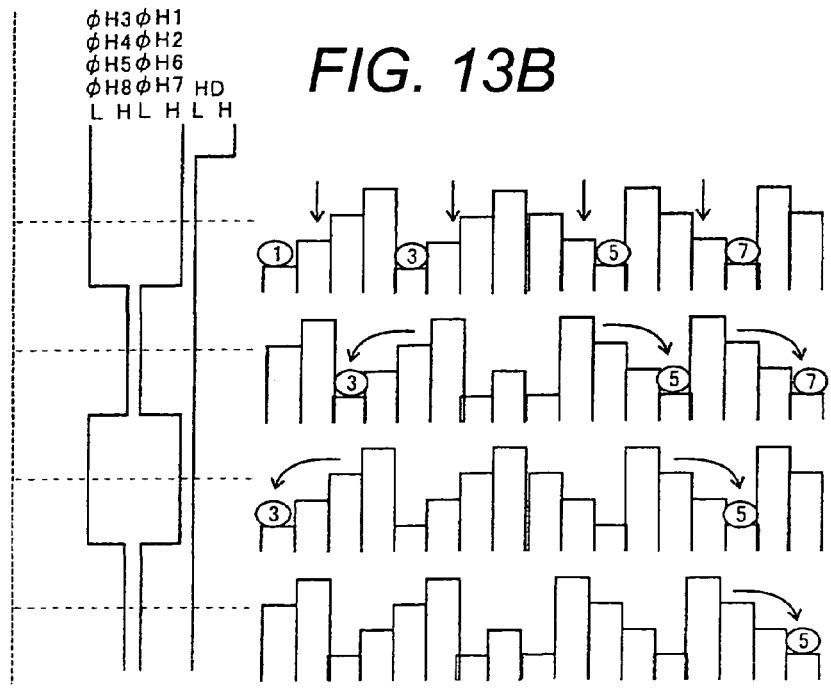

FIG. 13A and FIG. 13B are diagrams for explaining a driving method when the signal electric charges are transferred to two directions, left and right, by using the first HCCD 14a and the second HCCD 14b according to the second embodiment of the present invention. In the drawings, timing charts are on the left side, and electric potential diagrams of the impurity layers 3 and 4 in FIG. 12 corresponding to the timing charts are on the right side.

The signal electric charges transferred from the VCCD 12 are accumulated in the impurity layer 3 under the electrode 6 via the impurity layer 4 under the electrode 7. Then, as shown in the electric potential diagram, the signal electric charges positioned in the center part are divided and accumulated under the H3 electrode and under the H5 electrode at first. As shown in the timing chart, the signal electric charges under the H5 electrode are moved to under the H3 electrode by imposing the low voltage on φh5 first. After that, the signal charges are transferred to the left direction by the HCCD 14a and to the right direction by the HCCD 14b by the inverted clock movement wherein φH1, φH2, φH6 and φH7 are defined as one unit, and φH3, φH4, φH5 and φH8 are defined as another unit.

Figure 14A:
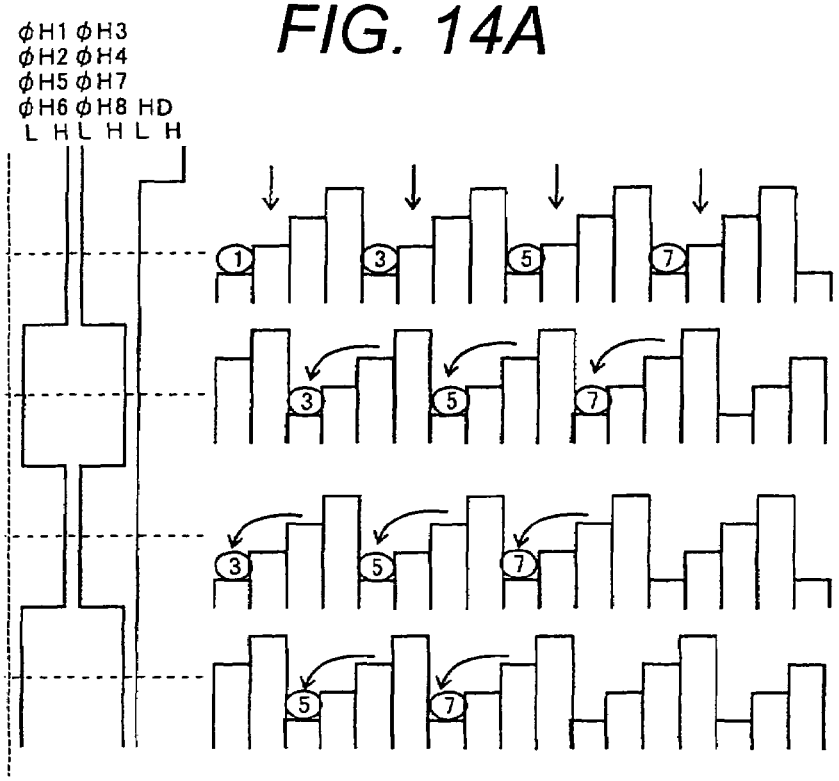
FIG. 14A and FIG. 14B are diagrams for explaining a driving method at a time that the signal electric charges are transferred to one direction (for example, left direction in the diagram) by using the first HCCD 14a and the second HCCD 14b according to the second embodiment of the present invention.
Figure 14B:
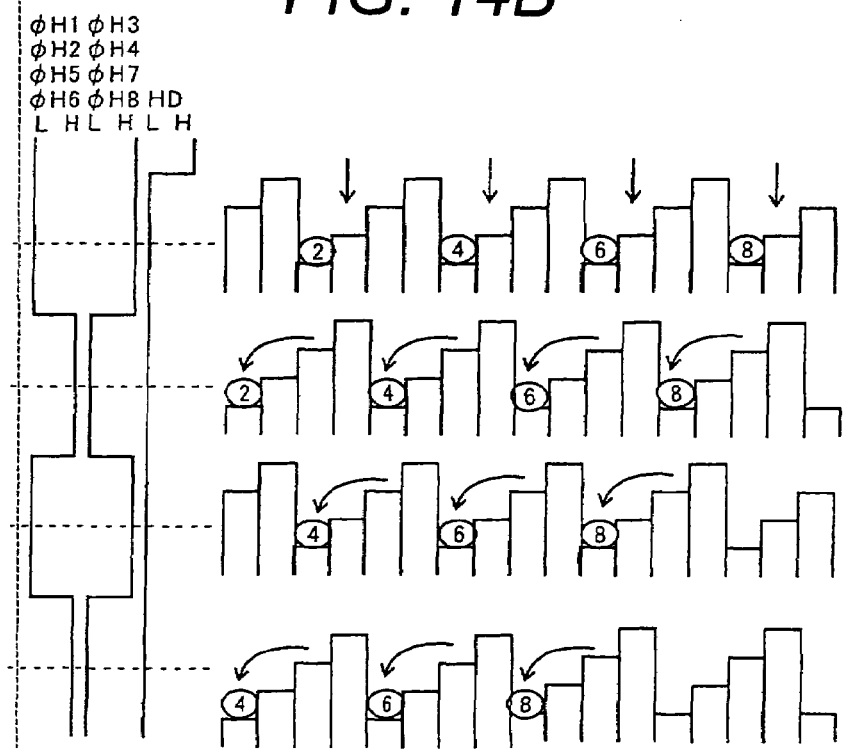

FIG. 14A and FIG. 14B are diagrams for explaining a driving method when the signal electric charges are transferred to one direction, left or right, by using the first HCCD 14a and the second HCCD 14b according to the second embodiment of the present invention. In the drawings, timing charts are on the left side, and electric potential diagrams of the impurity layers 3 and 4 in FIG. 12 corresponding to the timing charts are on the right side.

The signal electric charges transferred from the VCCD 12 are temporally accumulated in the impurity layer 3 under the impurity layer 4 under the electrode 7. Then, as shown in the timing chart, the signal charges are transferred to the left direction by the both of the HCCD 14a and the HCCD 14b by the inverted clock movement wherein φH1, φH2, φH5 and φH6 are defined as one unit, and φH3, φH4, φH7 and φH8 are defined as another unit. Also, the signal electric charges can be transferred to the right direction by the both of the HCCD 14a and the HCCD 14b by the inverted clock movement wherein φH2, φH3, φH6 and φH7 are defined as one unit, and φH1, φH4, φH5 and φH8 are defined as another unit. A reflective image (mirror image) can be generated by transferring to the right direction, and it can be used for a picture projected on a rear view mirror equipped on a car.

As described in the first embodiment, in the second embodiment and in those modified examples of the embodiments of the present invention, transferring direction can be arbitrary selected from the two lines (the HCCD 14a and the HCCD 14b) of directions by changing the electrode wiring and the driving timing, and the transfer to the two directions and the transfer to one direction can properly used depending on necessity.

When a horizontal transfer to only one direction is executed, for example, in the peripheral circuit for an output of the solid state imaging apparatus, the output is only the OS1, and only one line may be operated in the output amplifier 15 and the analogue front end (AFE) 21.

Therefore, when the horizontal transfer to two direction is not necessary, the power consumption for the operation of the output amplifier can be decreased to about a half. Also, the power consumption for the AFE operation can be decreased to about a half.

Moreover, since the output becomes one line, when the horizontal transfer to two directions is not necessary, the correction/synthesizing circuit 22 becomes needless. Therefore, the power consumption for the operation of the correction/synthesizing circuit can also be decreased.

Moreover, in the embodiment of the present invention, although the examples for imposing the driving pulses with four-phase or eight-phase have been explained, it is not limited to that, and six-phase driving pulse may be imposed.

The present invention has been described in connection with the preferred embodiments. The invention is not limited only to the above embodiments. It is apparent that various modifications, improvements, combinations, and the like can be made by those skilled in the art.

What are claimed are:

1. A solid state imaging apparatus, comprising:
   a semiconductor substrate of one electric conductive type;
   a multiplicity of photoelectric conversion elements arranged on the semiconductor substrate in rows and columns, and each of which generates a signal electric charge corresponding to incident rays;
   a vertical electric charge transferring device that is arranged between the columns of the photoelectric conversion elements in a vertical direction and transfers the signal electric charges generated by the photoelectric conversion elements;
   a horizontal electric charge transferring device that temporarily stores the signal electric charges transferred from the vertical electric charge transferring device and transfers the signal electric charges to a horizontal direction in a sequential order, wherein the horizontal electric charge transferring device comprises at least two lines of horizontal shift registers and an electrode structure with which one shift register can transfer the signal electric charges to a direction that is 180 degrees different from another shift register and also can transfer the signal electric charges to a same direction as the another shift register continuously with the other shift register by changing driving of at least one of the shift registers; and
   output detecting devices that detect the signal electric charges transferred by the horizontal electric charge transferring device.

2. The solid state imaging apparatus according to claim 1, wherein adjoining two electrodes of said another horizontal shift register are electrically connected whereas adjoining two electrodes of said one horizontal shift register are not electrically connected.

3. A method for driving a solid state imaging apparatus comprising: a semiconductor substrate of one electric conductive type; a multiplicity of photoelectric conversion elements arranged on the semiconductor substrate in rows and columns, and each of which generates a signal electric charge corresponding to incident rays; a vertical electric charge transferring device that is arranged between the columns of the photoelectric conversion elements in a vertical direction and transfers the signal electric charges generated by the photoelectric conversion elements; a horizontal electric charge transferring device that temporarily stores the signal electric charges transferred from the vertical electric charge transferring device and transfers the signal electric charges to a horizontal direction in a sequential order, wherein the horizontal electric charge transferring device comprises at least two lines of horizontal shift registers; and output detecting devices that detect the signal electric charges transferred by the horizontal electric charge transferring device, wherein
   one shift register can transfer the signal electric charges to a direction that is 180 degrees different from another shift register and also can transfer the signal electric charges to a same direction as the another shift register continuously with the other shift register by changing driving of at least one of the shift registers.

* * * * *